United States Patent [19]

Hori et al.

[11] Patent Number: 4,792,310
[45] Date of Patent: Dec. 20, 1988

[54] CONNECTOR HAVING FILTERING FUNCTION

[75] Inventors: Toshio Hori, Fukui; Yasuo Fujiki, Takefu, both of Japan

[73] Assignee: Murata Manufacturing Co., Ltd., Kyoto, Japan

[21] Appl. No.: 721,632

[22] Filed: Apr. 9, 1985

[30] Foreign Application Priority Data

Apr. 11, 1984 [JP] Japan ............................. 59-53813[U]

[51] Int. Cl.⁴ ............................................ H01R 13/66
[52] U.S. Cl. ..................................... 439/620; 333/181
[58] Field of Search ............................... 333/181, 182; 339/147 R; 439/620

[56] References Cited

U.S. PATENT DOCUMENTS

| | | | |
|---|---|---|---|
| 2,940,058 | 6/1960 | Foster | 333/182 |
| 3,275,953 | 9/1966 | Coda et al. | 333/182 |
| 3,538,464 | 11/1970 | Walsh | 333/182 |
| 3,569,915 | 3/1971 | Sorensen et al. | 333/182 |
| 3,711,794 | 1/1973 | Tasca et al. | 361/56 |
| 3,961,294 | 6/1976 | Hollyday | 339/147 R |
| 4,021,759 | 5/1977 | Campi | 361/56 |
| 4,021,760 | 5/1977 | Campi | 361/56 |
| 4,198,613 | 4/1980 | Whitley | 361/56 |
| 4,262,268 | 4/1981 | Shimada et al. | 333/182 |
| 4,275,945 | 6/1981 | Krantz et al. | 333/182 |
| 4,306,205 | 12/1981 | Ito et al. | 333/185 |
| 4,374,369 | 2/1983 | Sakamoto et al. | 333/185 |

*Primary Examiner*—Gil Weidenfeld
*Assistant Examiner*—Gary F. Paumen
*Attorney, Agent, or Firm*—Wenderoth, Lind & Ponack

[57] ABSTRACT

A connector having the filtering function is disclosed. An electrically conductive radiating plate is provided with a plurality of feed through capacitor elements, the radiating plate being installed in a metallic shell under the condition that it is electrically connected with the shell, and a central conductor passing through each of the feed through capacitor elements being connected with a specified circuit at both ends thereof.

Each of the feed through capacitor elements is formed of an electrode provided on the inside and outside circumferential surface of a cylindrical dielectric having a function of a varistor, an outside electrode being electrically connected with the radiating plate, an inside electrode being electrically connected with the central conductor, and each of the feed through capacitor elements absorbing and eliminating noises and abnormal voltages in the connector thereby eliminating the necessity of adding a separate varistor and the like to a printed substrate later on.

12 Claims, 3 Drawing Sheets

CONNECTOR HAVING FILTERING FUNCTION

The present invention relates to a connector, in particular to a connector, in which the necessity of adding a separate varistor later on is eliminated by using a capacitor obtained by adding a function of a varistor to a feed through capacitor element which is a noise-eliminating element.

A feed through capacitor element used in the conventional connector having a filtering function can not sufficiently absorb and eliminate abnormal voltages due to thunders, ignition noises of cars, static electricity and the like.

Referring now to FIG. 1 showing one example of the use of the conventional connector having a filtering function by using a feed through capacitor element therein, a varistor 15 is installed over a group of signal lines 13 and a ground line 14 on a printing substrate 12 electrically connected with a connector 11 later on by soldering to construct a circuit as shown in FIG. 2 and absorbs and eliminates said abnormal voltages.

However, a method, in which a separate varistor is installed later on, has problems such as high cost due to the number of parts and the additional process steps of assembling these parts on a printing substrate and an enlarged area for assembling those parts on the printing substrate due to the increased number of parts, whereby electronic instruments are difficult to miniaturize.

Accordingly, it is an object of the present invention to provide a connector having a filtering function in which the number of parts to be assembled on a printing substrate can be reduced.

It is another object of the present invention to provide a connector having a filtering function in which the number of the process steps for assembling parts can be reduced by reducing the number of the parts to be assembled whereby the assembling cost and the cost of materials can be reduced.

It is a further object of the present invention to provide a connector having a filtering function in which an area for assembling the parts on a substrate can be reduced, whereby it is possible to miniaturize an electronic instrument.

BRIEF DESCRIPTION OF THE DRAWINGS

The above described and other objects and features of the present invention will be detailedly understood by reading the following description with reference to the attached drawings showing one preferred embodiment of a connector according to the present invention.

DETAILED DESCRIPTION OF THE PREFERRED EMBODIMENTS

Figure 1:
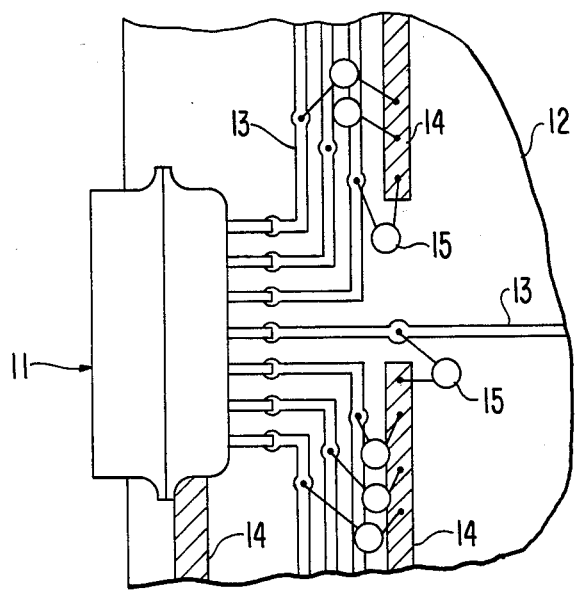
FIG. 1 is an outlined plan view showing means for absorbing and eliminating abnormal voltages using the conventional connector having a filtering function therein.
Figure 2:
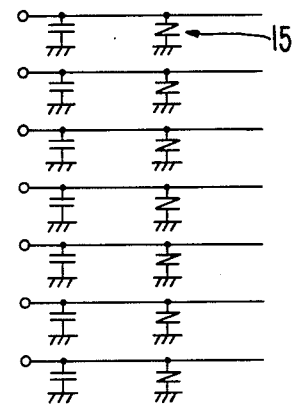
FIG. 2 is a diagram showing an equivalent circuit of the means shown in FIG. 1.
Figure 3:
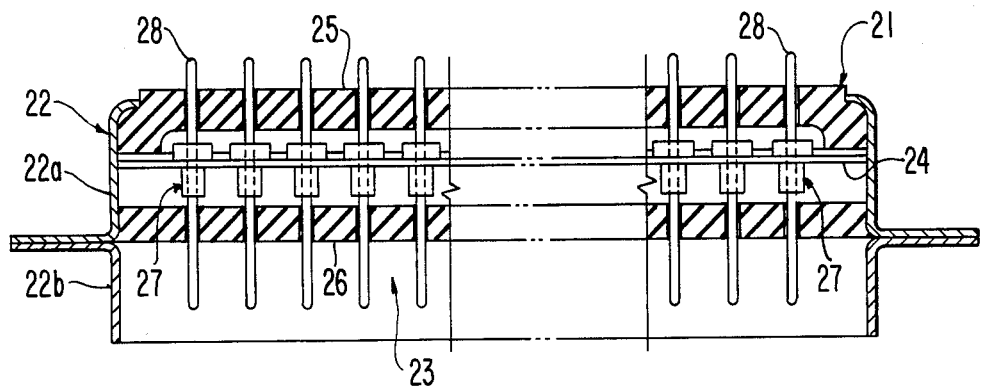
FIG. 3 is a partially omitted longitudinal sectional view showing a connector having a filtering function according to the present invention.

Referring now to FIG. 3 showing one example of a connector 21 having a filtering function according to the present invention, a shell 22 made of an electrically conductive material, for example a metallic material is formed by joining a set of the upper divided portion 22a and the lower divided portion 22b, which have a laterally long rectangular and cylindrical shape, together, the lower divided portion 22b being provided with an opening 23 into which a female connector (not shown) is inserted.

The upper divided portion 22a of said shell 22 is provided with an electrically conductive and heat radiating plate 24 fixed by for example soldering so as to electrically connected with the shell 22 therein, insulating members 25, 26 being provided over and below the radiating plate 24, said radiating plate 24 being provided with a plurality of feed through capacitor elements 27 fixedly inserted thereinto, and a central conductor (contact) 28 passing through each of the capacitor elements 27 passing through the upper and lower insulating members 25, 26.

Said radiating plate 24 serves as a ground-plate for electrically connecting a ground-electrode of the feed through capacitor element 27 with the shell 22 and simultaneously radiates the heat generated when the feed through capacitor element 27 functions as a varistor element absorbing abnormal voltages.

In addition, the upper end, which is located outside of the shell 22, of the central conductor 28 may be the side for insertion into for example the printing substrate and the lower end, which is located inside the shell 22, of the central conductor 28 may be formed in a female shape.

Figure 4:
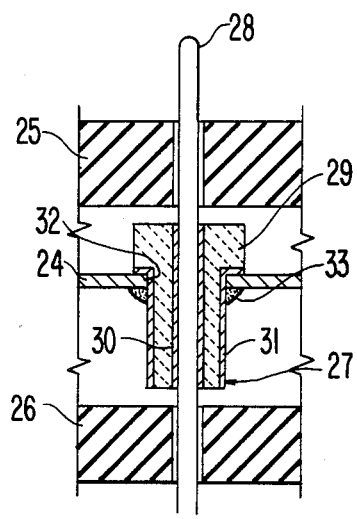
FIG. 4 is an enlarged sectional view showing the first example of a feed through capacitor element portion in a connector shown in FIG. 3.

Referring to FIG. 4 showing the first example of the installing construction of the feed through capacitor element 27 on the radiating plate 24, the capacitor element consists of an inside electrode 30 provided on the inside circumferential surface of a through hole or opening passing through the central axis of a dielectric 29, which is cylindrical in shape and has a stepped portion of larger diameter on the upper outside circumferential surface thereof, and an outside electrode 31 provided on the outside circumferential surface of smaller diameter, and provided on the lower side of stepped portion of larger diameter if necessary, said dielectric 29 being formed of a material having a function of a varistor such as barium titanate ceramic, strontium titanate ceramic, silicon carbide sintered body and zinc oxide ceramic, and the central conductor 28 passing through the through hole of the capacitor element being connected with the inside electrode 30.

The connector 21 having a filtering function is constructed by providing an opening 32 for inserting a portion of smaller diameter of the dielectric 29 at a capacitor element installing portion of the radiating plate 24 and connecting the outside electrode 31 of the dielectric 29 with the radiating plate 24 by means of a solder 33 under the condition that the stepped portion of larger diameter is placed on the radiating plate 24.

Figure 5:
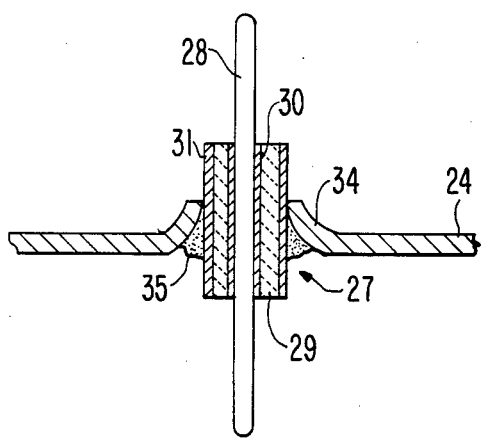
FIG. 5 is an enlarged sectional view showing the second example of a feed through capacitor element portion in a connector shown in FIG. 3.

Referring to FIG. 5 showing the second example, the cylindrical dielectric 29 without having the stepped portion of larger diameter is formed of the same material as in the first example, the inside electrode 30 being provided on the inside circumferential surface of the dielectric 29 and the outside electrode 31 being provided on the outside circumferential surface of the dielectric 29 to from the capacitor element, and the central conductor 28 passing through the through hole being connected with the inside electrode 30. The radiating plate 24 is provided with holes having a tang 34 on either side thereof, the dielectric 29 being inserted and temporarily gripped in the tang 34, and the outside electrode 31 being connected with the radiating plate 24 with a solder 35.

Figure 6:
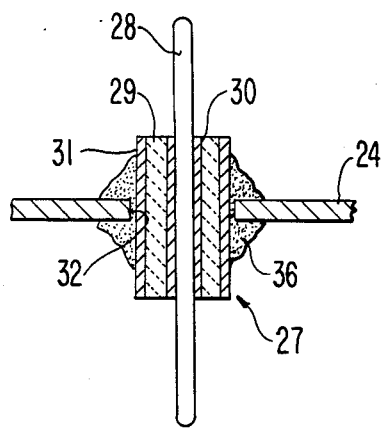
FIG. 6 is an enlarged sectional view showing the third example of a feed through capacitor element portion in a connector shown in FIG. 3.

Referring to FIG. 6 showing the third example, a capacitor element without having a stepped portion of larger diameter is used similarly to the second example, a dielectric 29 being inserted into a hole 32 provided in a radiating plate 24, and an outside electrode 31 being fixedly connected with the radiating plate 24 with a solder 36.

Figure 7:
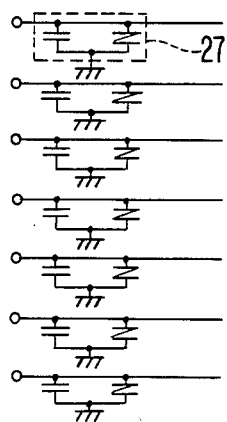
FIG. 7 is a diagram showing an equivalent circuit of a connector shown in FIG. 3.
Figure 8:
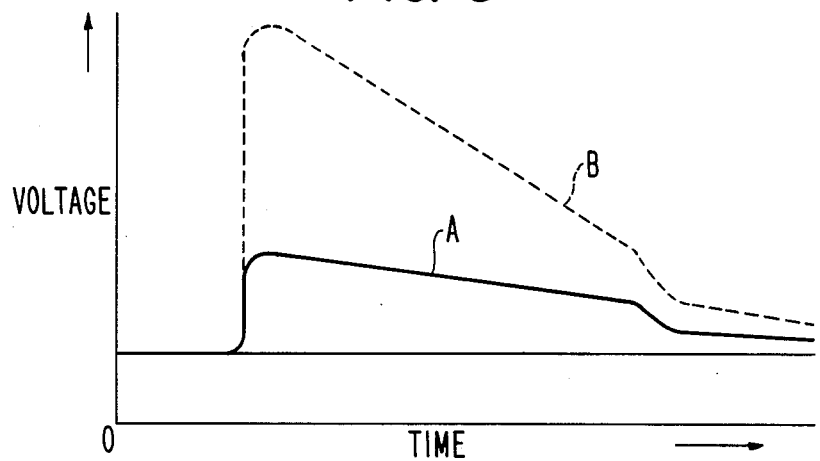
FIG. 8 is a diagram showing a surge-absorbing characteristic of a connector.

The connector 21 using a feed through capacitor element, as shown in the first to third examples discussed above, can construct a circuit having the filtering function as shown in FIG. 7, a full line A in FIG. 8 showing a surge-absorbing wave shape of said feed through capacitor element, and a broken line B in FIG. 8 showing a surge-absorbing wave shape of the conventional feed through capacitor element.

Figure 9:
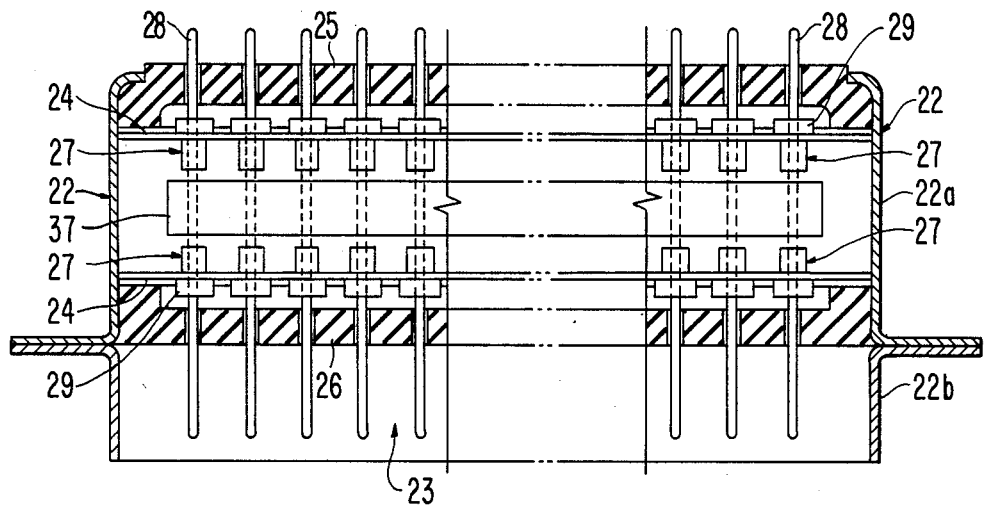
FIG. 9 is a partially omitted sectional view showing the second example of a connector according to the present invention.

Next, FIG. 9 shows the second example of a connector having an improved noise-absorbing function in which the same parts as in the connector in said first example are designated by the same numerals as in the first example, so that the explanation of the numerals is omitted.

Referring to FIG. 9, the shell 22 is provided with the upper and lower radiating plates 24 and a magnetic body member 37 between the upper and lower radiating plates 24, 24 therein such as a ferrite having a plurality of through holes.

Figure 10:
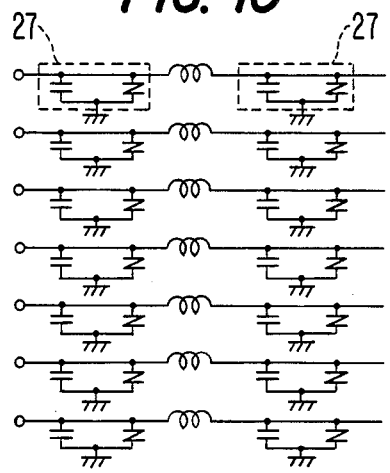
FIG. 10 is a diagram showing an equivalent circuit of a connector shown in FIG. 9.

The upper and lower radiating plates 24, 24 are provided with cylindrical dielectric 29 fixedly mounted at upper and lower corresponding positions thereof, a central conductor 28 passing through each of the through holes through the upper dielectric 29, the lower dielectric 29 and the magnetic body member 37, and an inside electrode of the upper and lower dielectrics 29, 29 being fixedly connected with the central conductor 28 whereby a connector having an equivalent circuit as shown in FIG. 10 and a π type filter is formed for each central conductor 28 to obtain a connector having a high noise-absorbing function. In addition, a connector having such a construction that three or more radiating plates are provided at the appointed intervals, each of the radiating plates being provided with a through capacitor element, and a magnetic body member being arranged between adjacent radiating plates may be obtained. Said magnetic body member 37 is not limited to the embodiment shown in FIG. 9. Said magnetic body member 37 may be independent with respect to each of the central conductors 28.

The abnormal voltages can be absorbed and eliminated in the connector by using a feed through capacitor element having the function of a varistor, as described in each of the examples whereby it is not required to install a separate varistor and the like on a printing substrate later on. As a result, an increase of the number of parts and the working process steps can be controlled whereby an area for assembling the parts on the substrate can be reduced.

What is claimed is:

1. A connector having a filtering function comprising:

an electrically conductive shell;

plate means for radiating heat comprising at least one electrically conductive and heat radiating plate disposed within said shell and electrically connected thereto, said plate having a plurality of holes therein;

a feed through element means, mounted in each of said holes, for performing the functions of a varistor and a capacitor in absorbing abnormal voltages and eliminating noise, respectively, said feed through element means dielectric body and being connected to said plate, said outer surface of said dielectric body being cylindrical with one end thereof having a diameter sized to pass through said holes and the other end thereof having a stepped portion of larger diameter than said one end, said other end being mounted with said outer electrode on said stepped portion in contact with said plate; and an inner electrode mounted within said opening on an inner surface of said dielectric body; and a central conductor electrically connected to said inner electrode for connecting said feed through element means to a mating electrical connector, said central conductor passing through and extending from either side of said opening in said dielectric body.

2. The connector of claim 1, wherein said dielectric body comprises barium titanate ceramic.

3. The connector of claim 1, wherein said dielectric body comprises strontium titanate ceramic.

4. The connector of claim 1, wherein said dielectric body comprises silicon carbide sintered body.

5. The connector of claim 1, wherein said dielectric body comprises zinc oxide ceramic.

6. A connector having a filtering function comprising:

an electrically conductive shell;

plate means for radiating heat comprising a plurality of spaced-apart electrically conductive and heat radiating plates disposed within said shell and electrically connected thereto, each of said plates having a plurality of holes therein;

a feed through element means, mounted in each of said holes in each of said plates, for performing the functions of a varistor and a capacitor in absorbing abnormal voltages and eliminating noise, respectively, said feed through element means including a dielectric body having an opening therethrough; an outer electrode mounted on an outer surface of said dielectric body and being connected to a respective one of said plates, said outer surface of said dielectric body being cylindrical with one end thereof having a said one end, said other end being mounted with said outer electrode on said stepped portion in contact with a respective one of said plates; and an inner electrode mounted within said opening on an inner surface of said dielectric body;

a central conductor electrically connected to said inner electrode for connecting said feed through element means to a mating electrical connector, said central conductor passing through and extending from either side of said opening in said dielectric body; and a magnetic body member having a plurality of holes therethrough mounted between each adjacent pair of said plates, said central conductor passing through a respective one of said holes in said magnetic body member and through one of said feed through element means on each of said adjacent pair of said plates.

7. The connector of claim 6, wherein said dielectric body comprises barium titanate ceramic.

8. The connector of claim 6, wherein said dielectric body comprises strontium titanate ceramic.

9. The connector of claim 6, wherein said dielectric body comprises silicon carbode sintered body.

10. The connector of claim 6, wherein said dielectric body comprises zinc oxide ceramic.

11. A connector having a filtering function comprising:

an electrically conductive shell;

at least one electrically conductive and heat radiating plate disposed within said shell and electrically connected thereto, said plate having a plurality of holes therein;

a feed through element means, mounted in each of said holes, for performing the functions of a varistor and a capacitor in absorbing abnormal voltages and eliminating noise, respectively, said feed through element means including a dielectric body having an opening therethrough, said dielectric body being of a material selected from the group consisting of strontium titanate ceramic and silicon carbide sintered body; an outer electrode mounted on an outer surface of said dielectric body and being connected to said plate, said outer surface of said dielectric body being cylindrical with one end thereof having a diameter sized to pass through said holes and the outer end thereof having a stepped portion of larger diameter than said one end, said other end being mounted with said outer electrode on said stepped portion in contact with said plate; and an inner electrode mounted within said opening on an inner surface of said dielectric body; and a central conductor electrically connected to said inner electrode for connecting said feed through element means to a mating electrical connector, said central conductor passing through and extending from either side of said opening in said dielectric body.

12. The connector of claim 11, further comprising a plurality of plates disposed at intervals within said shell, each of said plates having a plurality of holes therein with a feed through element means mounted in each of said plurality of holes, at least one magnetic body member having at least one hole therethrough mounted between adjacent plates and said central conductor passing through said at least one hole in said magnetic body member and through opposite feed through element means on each of said adjacent plates.

* * * * *